(12) United States Patent
Khanna et al.

(10) Patent No.: US 12,712,505 B2
(45) Date of Patent: Aug. 18, 2026

(54) METHODS AND APPARATUS TO IMPROVE DIFFERENCE AMPLIFIERS

(71) Applicant: Texas Instruments Incorporated, Dallas, TX (US)

(72) Inventors: Ankit Khanna, Tucson, AZ (US); Dimitar Trifonov, Vail, AZ (US); Partha S. Basu, Oro Valley, AZ (US); Sudheer Gangula, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 589 days.

(21) Appl. No.: 17/977,840

(22) Filed: Oct. 31, 2022

(65) Prior Publication Data

US 2024/0146265 A1 May 2, 2024

(51) Int. Cl.
*H03F 3/45* (2006.01)

(52) U.S. Cl.
CPC .................... *H03F 3/45475* (2013.01); *H03F 2203/45594* (2013.01)

(58) Field of Classification Search
USPC .................. 330/69, 252, 253, 258, 259, 260
See application file for complete search history.

(56) References Cited

U.S. PATENT DOCUMENTS 5,498,984 A 3/1996 Schaffer
11,296,666 B1 * 4/2022 Larsen .................... H03F 3/187
2010/0079132 A1 4/2010 Steele et al.
2013/0234685 A1 * 9/2013 Thoka ................. H03F 3/45475 323/282
2018/0145543 A1 5/2018 Piasecki
2018/0246144 A1 8/2018 Kaya
2021/0048453 A1 2/2021 Chao
2021/0231708 A1 7/2021 Minami
2022/0140105 A1 5/2022 Lee et al.

OTHER PUBLICATIONS

Tran, Chau and Rombola, Jordyn “A Low Power, Low Cost, Differential Input to a Single-Ended Output Amplifier” (Year: 2017).*
International Search Report for PCT/US2023/036277, dated Mar. 27, 2024.

* cited by examiner

*Primary Examiner* — Andrea Lindgren Baltzell
*Assistant Examiner* — Nareh Shamiryan
(74) *Attorney, Agent, or Firm* — Xianghui Huang; Frank D. Cimino

(57) ABSTRACT

An example apparatus includes: a differential amplifier including: an inverting input coupled to a first input via a first resistor; a non-inverting input coupled to a second input via a second resistor; a first supply input coupled to the first input via a third resistor, and the first supply input coupled to the second input via a fourth resistor; a second supply input coupled to a current source; a non-inverting output; and an inverting output; a first transistor including a first control terminal and a first current terminal, the first control terminal coupled to the non-inverting output and the first current terminal coupled to the inverting input; and a second transistor including a second control terminal and a second current terminal, the second control terminal coupled to the inverting output and the second current terminal coupled to the non-inverting input.

25 Claims, 6 Drawing Sheets

400
410
420
405
415
425
430
435
440
445
450
455
V(V)
V(V)
V(V)
5.0
3.9
2.8
1.7
0.6
-0.5
110.0
-10.0
360.0
380.0
400.0
420.0
440.0
460.0
480.0
500.0
520.0
540.0
TIME (mS)

METHODS AND APPARATUS TO IMPROVE DIFFERENCE AMPLIFIERS

TECHNICAL FIELD

This description relates generally to difference amplifiers, and more particularly to methods and apparatus to improve difference amplifiers.

BACKGROUND

In-line current sensing is commonly achieved by determining a voltage difference across a resistor which was placed in circuitry where the current measurement is to be determined. Controller circuitry divides the voltage difference across the resistor by the resistance of the resistor to determine the current flowing through the resistor. Typically, in-line current sensing includes a resistor with a relatively small resistance and a difference amplifier. The difference amplifier is coupled to the relatively small resistor by a first reference input and a second reference input. The difference amplifier converts a voltage difference across the relatively small resistor from a differential voltage at a common-mode voltage to a single-ended voltage in reference to a common potential (e.g. ground). For example, an output of the difference amplifier is five millivolts (mV) when the first reference input is sixty and five thousandths volts (V), the second reference input is sixty volts (V), and the difference amplifier is configured to amplify the output by a gain of one. In such an example, controller circuitry could apply Ohm's law to calculate a current through the relatively small resistor to be five amps (A) when a resistance of the relatively small resistance is one milliohm (me).

SUMMARY

For methods and apparatus to reduce common-mode rejection in difference amplifiers, an example apparatus includes a differential amplifier including: an inverting input coupled to a first input via a first resistor; a non-inverting input coupled to a second input via a second resistor; a first supply input coupled to the first input via a third resistor, and the first supply input coupled to the second input via a fourth resistor; a second supply input coupled to a current source; a non-inverting output; and an inverting output; a first transistor including a first control terminal and a first current terminal, the first control terminal coupled to the non-inverting output and the first current terminal coupled to the inverting input; and a second transistor including a second control terminal and a second current terminal, the second control terminal coupled to the inverting output and the second current terminal coupled to the non-inverting input.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
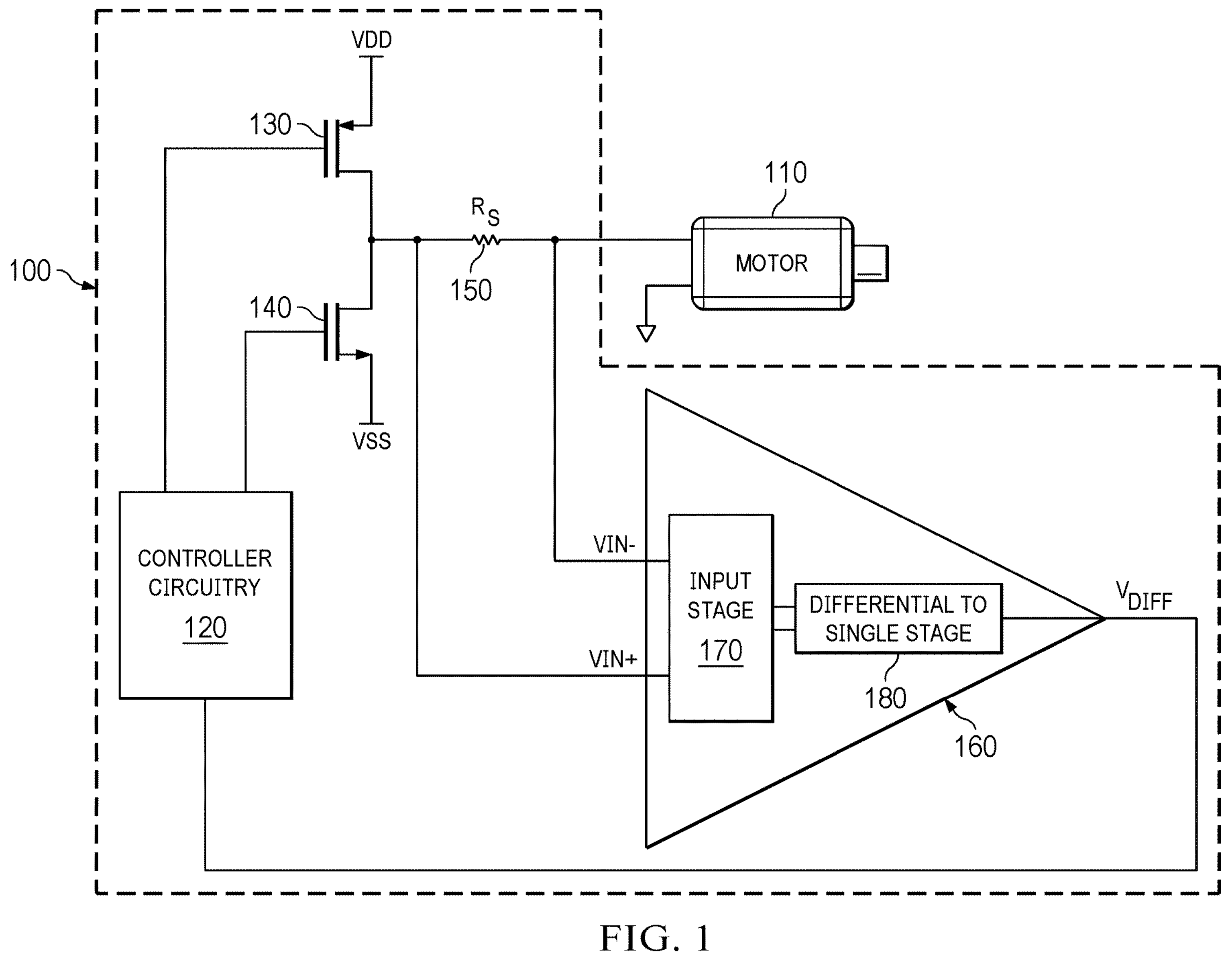
FIG. 1 is a schematic diagram of an example motor driver configured to supply power to an example motor based on voltage output of an example difference amplifier.

The drawings are not necessarily to scale. Although the drawings show layers with clean lines and boundaries, some or all of these lines and/or boundaries may be idealized. In reality, the boundaries and/or lines may be unobservable, blended and/or irregular.

Applications which require current measurements may include a series resistor at a location where current is to be measured. For example, a series resistor (also referred to as an "in-line" resistor) may be incorporated into a supply path to a motor so as to be able to measure current supplied to the motor from the supply. Such applications measure a voltage difference across the resistor to determine current flowing through the resistor. For example, Ohm's law allows applications to calculate a current flowing through a resistor by dividing a voltage drop across the resistor by the resistance of the resistor. Such a method of current sensing may be referred to as "in-line current sensing". An example implementation of in-line current sensing comprises a resistor (e.g., with a relatively small resistance) and a difference amplifier. The relatively small resistor is placed between two points where current is to be measured. The relatively small resistor includes a resistance, which is configured to be relatively small, so as to decrease any voltage difference resulting from the addition of the resistance.

The difference amplifier includes a first reference input and a second reference input coupled across the relatively small resistor. Typically, the difference amplifier includes a configurable gain, which allows voltage differences to be amplified by the configured gain. The difference amplifier generates an output voltage approximately equal to the gain times the voltage difference between the first reference input and the second reference input. For example, the output voltage of the difference amplifier is ten volts (V) when the first reference input is twenty volts (V), the second reference input is fifteen volts (V), and the difference amplifier includes a gain of two.

Difference amplifiers are configured to remove a common-mode voltage from the reference inputs. The common-mode voltage is an offset voltage common to both of the reference inputs. For example, a difference amplifier removes a common-mode voltage of approximately sixty volts (V) when the first reference input is coupled to sixty volts (V) and the second reference input is coupled to sixty-five volts (V). Difference amplifiers are capable of accurately determining voltage differences between reference inputs when both of the reference inputs are within a common-mode range of the difference amplifier. A common-mode range of a difference amplifier is a range of potentials (voltages) that may be coupled to the reference inputs. For example, a difference amplifier with a common-mode range from minus sixteen volts (V) (−16V) to plus eighty volts (V)

(+80V) allows the reference inputs to be coupled to any voltage between minus sixteen volts (V) and plus eighty volts (V). In some applications, such as manufacturing and automotive, difference amplifiers with relatively large common-mode ranges are needed to perform in-line current sensing. One method of increasing the common-mode range of a difference amplifier is to increase voltage supplies. However, increasing the voltage supply to a difference amplifier increases cost and complexity.

Some difference amplifiers include relatively large common-mode voltages with relatively low common-mode rejection ratio (CMRR). The CMRR is a ratio of a change in a voltage difference at the reference inputs over a change in the common-mode voltage. The CMRR characterizes the ratio of a gain resulting from changes in the common-mode to a gain resulting from changes in a differential voltage at the reference inputs. For example, a difference amplifier may generate a voltage output of approximately zero volts (V) when both of the reference inputs are coupled to a common potential (e.g., ground) but generates a voltage output of one-hundred millivolts (mV) when both of the reference inputs are coupled to one-hundred volts (V). Relatively low CMRR indicates an increasing offset error on a voltage output as the common-mode increases. Difference amplifiers are accurate across a wide range of common-mode voltages when the CMRR is relatively high. In applications, such as current sensing, a relatively low CMRR decreases an accuracy of voltage measurements represented by the output of the difference amplifier. One method of minimizing inaccuracies resulting from a relatively low CMRR while maintaining relatively high common-mode range is to include trim circuitry that is configured to modify circuitry comprising the difference amplifier to reduce the gain resulting from changes in the common-mode. Such a method increases the system on chip (SoC) size and complexity.

The examples described herein include an example difference amplifier configured to support a relatively large common-mode range, achieve a high bandwidth, and a relatively low voltage offset on the voltage output. In some described examples, the difference amplifier includes input stage circuitry and a differential-to-single-ended converter stage. The input stage circuitry converts a differential voltage from a first reference input and a second reference input into a differential current using a single amplifier and transistors, which implement current feedback. The differential current is then converted by the differential-to-single-ended converter stage to a voltage output representative of the voltage difference between the reference inputs in reference to common potential.

In some of the described examples, the input stage includes a fully-differential amplifier and current feedback which creates a closed loop system that converts the voltage differential input to a differential current output. The fully-differential amplifier uses the reference inputs as a voltage source which enables a single amplifier capable of supporting both negative voltages and positive voltages in the common-mode range. In some described examples, an N-type buried layer (also referred to as an "N-buried layer") is placed between a buried oxide and P-type regions of a semiconductor device of the fully-differential amplifier to decrease settling time following a relatively large common-mode transient.

FIG. 1 is a schematic diagram of an example motor driver 100 configured to supply power to an example motor 110. In the example of FIG. 1, the motor driver 100 includes example controller circuitry 120, a first example transistor 130, a second example transistor 140, an example resistor 150, and an example difference amplifier 160. The motor driver 100 powers the motor 110 based on a duration of time in which the controller circuitry 120 turns on the transistors 130 and/or 140. The motor driver 100 calculates current being supplied to the motor 110 using the resistor 150 and the difference amplifier 160.

In the example of FIG. 1, the controller circuitry 120 is coupled to the first transistor 130, the second transistor 140, and the difference amplifier 160. The controller circuitry 120 supplies power to the motor 110 by controlling the transistors 130 and 140. The controller circuitry 120 modifies a magnitude of power being supplied to the motor 110 by modifying a duration in time where the transistors 130 and/or 140 are turned on (e.g., conducting) or turned off (e.g., non-conducting). The controller circuitry 120 determines a magnitude of a current being supplied to the motor 110 by dividing a voltage output ($V_{DIFF}$) of the difference amplifier 160 by the resistance ($R_S$) of the resistor 150. For example, the calculated current flowing through the resistor 150 is one-hundred milliamps (mA) when the voltage output of the difference amplifier 160 is one millivolt (mV) and the resistance of the resistor 150 is ten milliohms (mΩ).

The first transistor 130 is coupled to the controller circuitry 120, the second transistor 140, the resistor 150, and a first reference potential (VDD). The first transistor 130 allows current to flow from the first reference potential towards the resistor 150 when turned on (by the controller circuitry 120, and the first transistor 130 prevents current from flowing from the first reference potential towards the resistor 150 and/or the second transistor 140 when turned off by the controller circuitry 120. The first transistor 130 is a P-channel metal oxide semiconductor field effect transistor (MOSFET). Alternatively, the first transistor 130 may be a PNP bipolar junction transistor (BJT), an N-channel field-effect transistor (FET), an N-channel insulated-gate bipolar transistor (IGBT), an N-channel junction field effect transistor (JFET), an N-channel MOSFET, a P-channel IGBT, a P-channel JFET, or an NPN BJT.

The second transistor 140 is coupled to the controller circuitry 120, the first transistor 130, the resistor 150, and a second reference potential (VS S) (e.g., a common potential such as ground). The second transistor 140 allows current to flow from the resistor 150 towards the second reference potential when turned on by the controller circuitry 120, and the second transistor 140 prevents current from flowing from the first transistor 130 and/or the resistor 150 when turned off by the controller circuitry 120. The second transistor 140 is an N-channel MOSFET. Alternatively, the second transistor 140 may be a PNP BJT, an N-channel FET, an N-channel IGBT, an N-channel JFET, a P-channel MOSFET, a P-channel FET, a P-channel IGBT, a P-channel JFET, or an NPN BJT.

The resistor 150 is coupled to the motor 110, the first transistor 130, the second transistor 140, and the difference amplifier 160. The resistor 150 has a resistance ($R_S$). Current flowing through the resistor 150 may be calculated by applying Ohm's law, such as to divide the voltage difference across the resistor 150 by the resistance.

The difference amplifier 160 is coupled to the motor 110, the controller circuitry 120, the first transistor 130, the second transistor 140, and the resistor 150. In the example of FIG. 1, the difference amplifier 160 includes an example input stage 170 and an example differential-to-single-ended stage 180. The difference amplifier 160 converts a voltage difference across the resistor 150 to a voltage output ($V_{DIFF}$).

The input stage 170 is coupled to the first transistor 130, the second transistor 140, and the resistor 150 by a first reference input ($V_{IN+}$). The input stage 170 is coupled to the motor 110 and the resistor 150 by a second reference input ($V_{IN-}$). The input stage 170 converts a differential voltage of the first and second reference inputs to a differential current. The input stage 170 may be referred to as a "transconductance stage". The input stage 170 includes circuitry configured to increase a common-mode range of the difference amplifier 160, increase the CMRR, decreases voltage offset, and decrease settling time. An example implementation of the input stage 170 is discussed in connection with FIG. 2, below. The input stage 170 supplies the differential current to the differential-to-single-ended stage 180.

The differential-to-single-ended stage 180 is coupled to the controller circuitry 120 and the input stage 170. The differential-to-single-ended stage 180 converts the differential current from the input stage 170 into a single-ended voltage representing the voltage difference across the first reference input ($V_{IN+}$) and the second reference input ($V_{IN-}$) (e.g., across the resistor 150) in reference to common potential (e.g., ground). The differential-to-single-ended stage 180 may be referred to as a "transimpedance stage". An example implementation of the differential-to-single-ended stage 180 is discussed in connection with FIG. 2, below. The differential-to-single-ended stage 180 supplies the voltage output to the controller circuitry 120.

Figure 2:
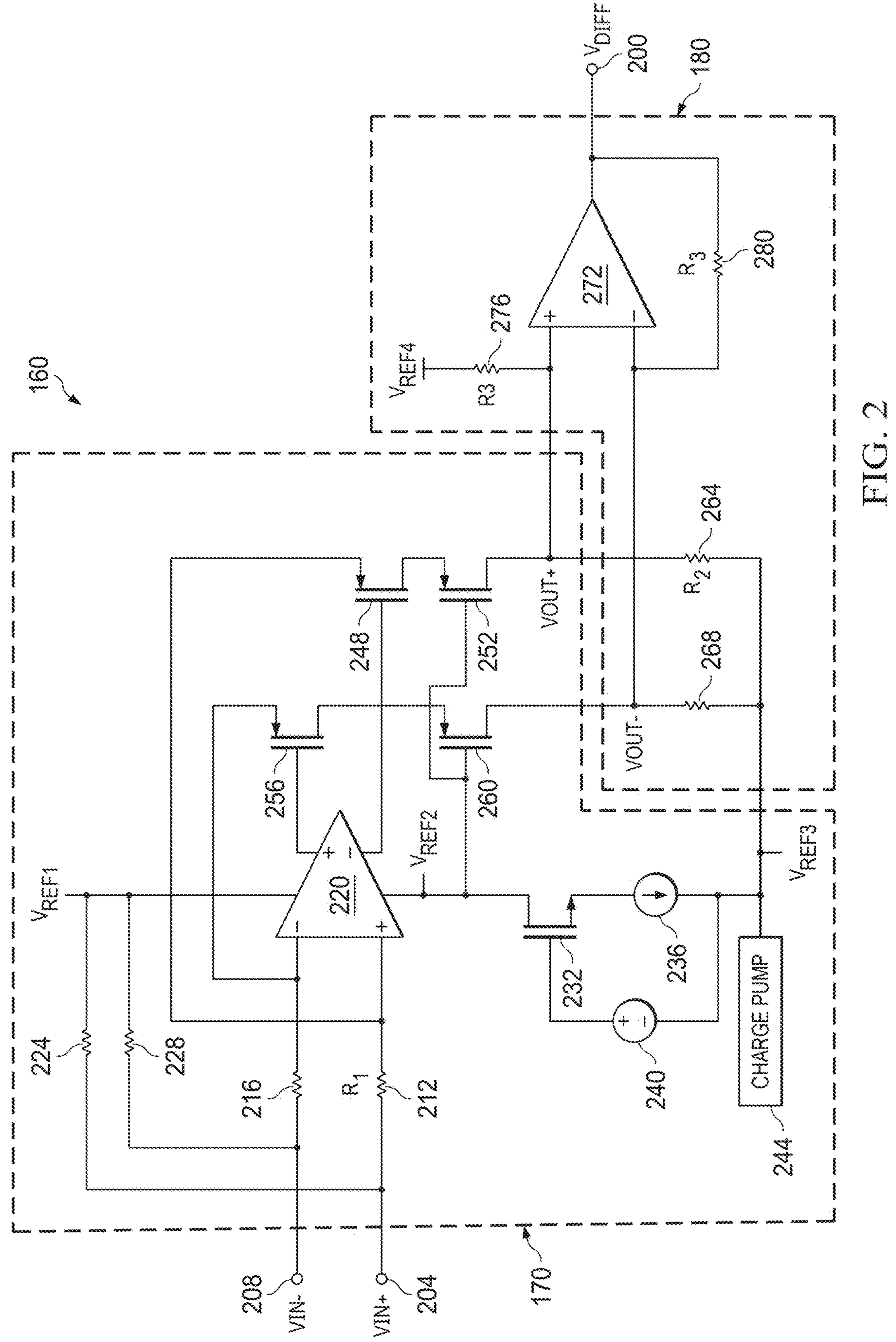
FIG. 2 is a schematic diagram of the difference amplifier of FIG. 1 including an input stage and a differential-to-single end converter stage.

FIG. 2 is a schematic diagram of the difference amplifier 160 of FIG. 1 including the input stage 170 of FIG. 1 and the differential-to-single-ended stage 180 of FIG. 1. The difference amplifier 160 generates a single-ended voltage at a voltage output ($V_{DIFF}$) 200 approximately equal to a gain of the amplifier times a voltage difference between a first reference input ($V_{IN+}$) 204 and a second reference input ($V_{IN-}$) 208. The reference inputs 204 and 208 may be referred to as reference terminals, such as a first reference terminal and a second reference terminal. The input stage 170 increases the common-mode range of the difference amplifier 160 using a feedback loop that causes circuitry (such as the input stage 170) to track the common-mode of the reference inputs 204 and 208. The input stage 170 increases the accuracy of the difference amplifier 160 by using current feedback to increase CMRR and reduce offset voltages. The differential-to-single-ended stage 180 converts a differential current output of the input stage 170 into a single-ended voltage, such that a voltage difference between the voltage output 200 and a common potential (e.g., ground) is approximately equal to the voltage difference between the reference inputs 204 and 208.

In the example of FIG. 2, the input stage 170 includes a first example resistor 212, a second example resistor 216, an example fully-differential amplifier 220, a third example resistor 224, a fourth example resistor 228, a first example transistor 232, an example current source 236, an example voltage source 240, an example charge pump 244, a second example transistor 248, a third example transistor 252, a fourth example transistor 256, and a fifth example transistor 260. The input stage 170 is coupled to the differential-to-single-ended stage 180 and the reference inputs 204 and 208. The reference inputs 204 and 208 are operable to be coupled to the resistors 212 and 216. The input stage 170 generates a differential current based on a voltage difference between the reference inputs 204 and 208. The input stage 170 supplies the differential current to the differential-to-single-ended stage 180.

The first resistor 212 is coupled to the first reference input 204, the fully-differential amplifier 220, the third resistor 224, and the second transistor 248. The first resistor 212 has a first resistance ($R_1$). The first resistor 212 allows the second transistor 248 to source current from the first reference input 204. The first resistor 212 supplies a voltage to the fully-differential amplifier 220 that is equal to the first reference input 204 minus a voltage difference (e.g., drop) across the resistor 212. The voltage difference across the first resistor 212 is equal to the first resistance times a magnitude of the current the second transistor 248 is sourcing. For example, the first resistor 212 supplies the fully-differential amplifier 220 with a voltage equal to the first reference input 204 by minus one volt (V) when the first resistance is one kiloohm (kΩ) and the second transistor 248 is sourcing one milliamp (mA).

The second resistor 216 is coupled to the second reference input 208, the fully-differential amplifier 220, the fourth resistor 228, and the fourth transistor 256. The second resistor 216 includes a resistance equal to the first resistance of the first resistor 212. The second resistor 216 allows the fourth transistor 256 to source current from the second reference input 208. The second resistor 216 supplies a voltage to the fully-differential amplifier 220 that is equal to the second reference input 208 minus a voltage difference across the second resistor 216. The voltage difference across the second resistor 216 is equal to the first resistance times a magnitude of the current the fourth transistor 256 is sourcing. For example, the second resistor 216 supplies the fully-differential amplifier 220 with a voltage equal to the second reference input 208 by minus one volt (V) when the first resistance is one-kiloohm (kΩ) and the fourth transistor 256 is sourcing one milliamp (mA).

The fully-differential amplifier 220 is coupled to the first resistor 212 at a non-inverting input (+). The fully-differential amplifier 220 is coupled to the second resistor 216 at an inverting input (−). The fully-differential amplifier 220 is coupled to the resistors 224 and 228 at a first source input ($V_{REF1}$). The fully-differential amplifier 220 is coupled to the transistors 232, 252, and 260 at a second source input ($V_{REF2}$). The source inputs of the fully-differential amplifier 220 may be referred to as supply inputs, such as a first supply input and a second supply input. The fully-differential amplifier 220 includes internal circuitry (not illustrated) that creates an internal feedback loop which regulates a potential difference between the first source input and the second source input. For example, the fully-differential amplifier 220 may include circuitry to regulate a two and a half volt (V) difference between the first source input and the second source input. The regulated potential difference between the source inputs allows the fully-differential amplifier 220 to follow the common-mode voltage of the reference inputs 204 and 208. The regulated potential difference causes the fully-differential amplifier 220 to adjust to variations in the common-mode of the reference inputs. Difference amplifiers which use a common-mode of the inverting and non-inverting inputs to adjust the supply inputs may be referred to as a "floating differential amplifier".

Figure 3:
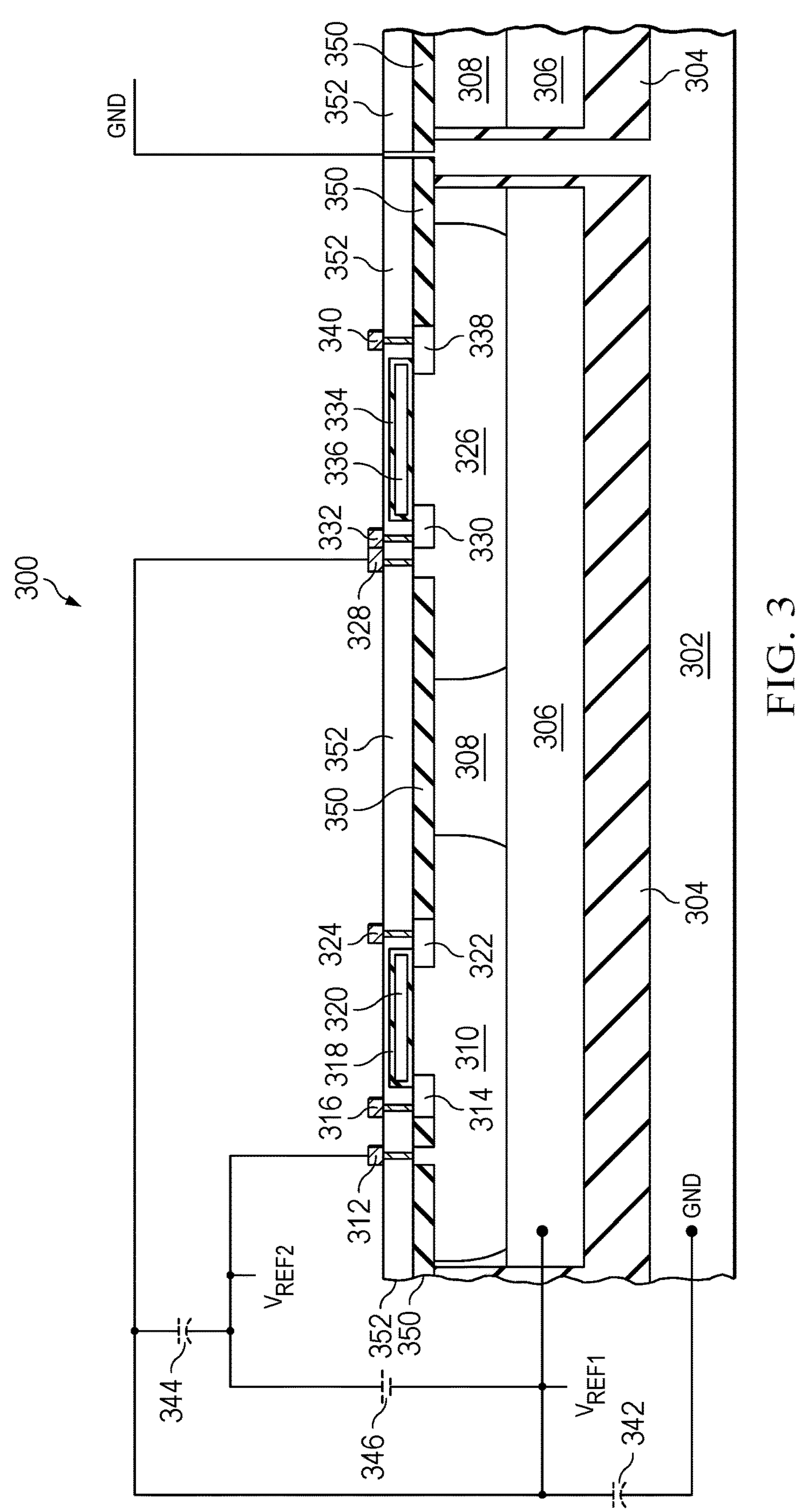
FIG. 3 is a cross-sectional view of an example portion of a semiconductor device including an N-type buried layer configured to construct an internal capacitance.

The fully-differential amplifier 220 may be manufactured to reduce common-mode transient step disturbances by adding an N-buried layer between a buried oxide layer and a P-doped layer (as illustrated in FIG. 3, for example). Common-mode transient step disturbance occurs when the voltage output 200 varies in response to rapid changes in a common-mode voltage of the reference inputs 204 and 208 (e.g., a rising edge or falling edge of a pulse width modulation signal). In the example of FIG. 2, common-mode transient step disturbance may occur if a rapid change in the common-mode of the reference inputs modifies the regulated potential difference between source inputs. The N-buried layer may be coupled to the first source input to allow the second source input, which is coupled to a P-doped region, to be isolated from a common potential (e.g., ground).

In some implementations, the P-doped layer is adjacent to the buried oxide and coupled to the second source input, which creates an internal capacitance between the second source input and a reference coupled to a substrate layer. Such an internal capacitance between the second source input and the reference coupled to the substrate layer causes variations in the second source input and not the first source input. The addition of the N-buried layer creates an internal capacitance between the first source input and the reference coupled to the substrate layer, which isolates the P-doped region from creating capacitance with the substrate layer. Such isolation, by the N-buried layer, reduces disturbances in the regulated potential difference caused by rapid variations in the potential difference of the source inputs.

An example semiconductor device including the addition of the N-buried layer is illustrated and described in further detail in connection with FIG. 3, below. Advantageously, the N-buried layer creates a capacitance between the first source input and the substrate layer that allows the second source input to vary with the first source input during relatively large variations in the common-mode voltage of the reference inputs 204 and 208.

The fully-differential amplifier 220 is coupled to the second transistor 248 at an inverting output (−). The fully-differential amplifier 220 is coupled to the fourth transistor 256 at a non-inverting output (+). The inverting output and the non-inverting output of the fully-differential amplifier 220 comprise a differential output. A fully-differential amplifier is an amplifier with a differential input and a differential output, such as the inverting and non-inverting inputs and the inverting and non-inverting outputs. The fully-differential amplifier 220 controls the transistors 248 and 256 based on voltages supplied to the non-inverting input and the inverting input by the resistors 212 and 216. The fully-differential amplifier 220 configures the voltages of the non-inverting input and the inverting input to be approximately equal to each other by turning on the transistors 248 and/or 256, such as to allow the transistors 248 and 256 to source current from the resistors 212 and 216. Such a configuration is a method of current feedback.

In such a configuration, the fully-differential amplifier 220 causes the transistors 248 and 256 to source differing magnitudes of currents through the resistors 212 and 216, which modify voltages at the inverting and non-inverting inputs of the fully-differential amplifier 220. The fully-differential amplifier 220 adjusts the amount of current being sourced by the transistors 248 and 256 when there is a voltage difference between the inverting input and the non-inverting input, such as when the reference inputs 204 and 208 differ. For example, a voltage difference across the reference inputs 204 and 208 causes the fully-differential amplifier 220 to modify the amounts of current the transistors 248 and 256 are sourcing. In such an example, the first resistor 212 decreases a voltage of the non-inverting input of the fully-differential amplifier 220 by a first voltage and the second resistor 216 decreases a voltage of the inverting input of the fully-differential amplifier 220 by a second voltage.

The fully-differential amplifier 220 is considered to be in a settled state when the first voltage and the second voltage set the non-inverting and the inverting inputs of the fully-differential amplifier 220 approximately equal to each other. Advantageously, the modifications to the transistor 248 and 256 to source a modified amount of current to set the inverting and non-inverting inputs equal to each other creates a current feedback loop. Advantageously, the current feedback loop of the input stage 170 allows the fully-differential amplifier to adjust to a wide range of voltages supplied to the reference inputs 204 and 208.

The voltage differences induced across the resistors 212 and 216, by turning on the transistors 248 and/or 256, represent a voltage difference between the reference inputs 204 and 208. The currents flowing through the transistors 248 and/or 256 are a differential current which represent the voltage difference between the reference inputs 204 and 208. Advantageously, the fully-differential amplifier 220 uses current feedback from the transistors 248 and 256 to induce voltage differences across the resistors 212 and 216 that represents a voltage difference between the reference inputs as a differential current.

The third resistor 224 is coupled to the first reference input 204, the first resistor 212, and the fully-differential amplifier 220. The third resistor 224 allows the first source input of the fully-differential amplifier 220 to source current from the first reference input 204. The third resistor 224 facilitates the voltage supply to the first source input of the fully-differential amplifier 220 equal to the first reference input 204 voltage minus a voltage difference resulting from the fully-differential amplifier 220 sourcing current. The voltage difference across the third resistor 224 is equal to a multiplication of the first resistance and approximately half of a magnitude of the current the fully-differential amplifier 220 is sourcing.

The fourth resistor 228 is coupled to the second reference input 208, the second resistor 216, and the fully-differential amplifier 220. The fourth resistor 228 allows the first source input of the fully-differential amplifier 220 to source current from the second reference input. The fourth resistor 228 facilitates the voltage supply to the first source input of the fully-differential amplifier 220 equal to the second reference input 208 voltage minus a voltage difference resulting from the fully-differential amplifier 220 sourcing current. The voltage difference across the fourth resistor 228 is equal to a multiplication of the first resistance and approximately half of the magnitude of the current the fully-differential amplifier 220 is sourcing.

The voltage at the first source input of the fully-differential amplifier 220, which results from the resistors 224 and 228, varies with the common-mode voltage of the reference inputs 204 and 208. Such a configuration allows the source inputs of the fully-differential amplifier 220 adjust to the common-mode of the reference inputs 204 and 208. Therefore coupling the first source input of the fully-differential amplifier 220 to the reference inputs 204 and 208 by the resistors 224 and 228 allows the fully-differential amplifier 220 to share the common-mode voltage of the reference inputs 204 and 208.

A drain of the first transistor 232 is coupled to the fully-differential amplifier 220 and the transistors 252 and 260. A drain and/or a source may be referred to as a current terminal. A source of the first transistor 232 is coupled to the current source 236. A gate of the first transistor 232 is coupled to the voltage source 240. A gate may be referred to as a control terminal or a control input. The first transistor 232 sources current to/from the second source input of the fully-differential amplifier 220. The first transistor 232 is configured to be always turned on. The first transistor 232 includes a relatively large impedance at the drain to allow a voltage difference between the drain and the source when turned on, while allowing current to flow from the drain to the source. Transistor 232 may be implemented by a power transistor, a high-voltage transistor, and/or a drain-extended transistor. Advantageously, the voltage of the second source input of the fully-differential amplifier 220 may be different from the common-mode voltage of the source. The first transistor 232 is an N-channel MOSFET. Alternatively, the first transistor 232 may be a PNP BJT, an N-channel FET, an N-channel IGBT, an N-channel JFET, a P-channel MOSFET, a P-channel FET, a P-channel IGBT, a P-channel JFET, or an NPN BJT.

The current source 236 is coupled to the first transistor 232, the voltage source 240, and the charge pump 244. The current source 236 supplies a set magnitude of current from the first transistor 232 to the charge pump 244. The current source 236 is configured to sink a bias current from the second source input of the fully-differential amplifier 220 to the charge pump 244. The fully-differential amplifier 220 supplies the current being sunk by the current source 236 by increasing an amount of current being supplied by the resistors 224 and 228 from the reference inputs 204 and 208. The additional current being sourced from the reference inputs 204 and 208, through the resistors 224 and 228, to supply the current source 236 sets a voltage of the first source input of the fully-differential amplifier 220 in relation to the common-mode voltage of the reference inputs 204 and 208.

As the common-mode voltage of the reference inputs 204 and 208 varies, the bias current continues to set the voltage of the first source input by generating a potential difference across the resistors 224 and 228. For example, when the common-mode voltage of the reference inputs 204 and 208 decreases, the bias current of the current source 236 causes the fully-differential amplifier 220 to decrease a voltage of the first source input by continuing to source the bias current through the resistors 224 and 228. In such an example, the second source input is set to the decreased voltage of the first source input minus the fixed potential difference. The bias current causes the internal feedback loop of the fully-differential amplifier 220, which creates the fixed potential difference between source inputs, to modify a voltage of the second source input as the first source input is set by the bias current. Advantageously, the current source 236 ensures the fixed potential difference between source inputs of the fully-differential amplifier 220 remains fixed, while the common-mode of the reference inputs 204 and 208 varies, by using the fully-differential amplifier 220 to source the bias current.

The voltage source 240 is coupled to the first transistor 232, the current source 236, and the charge pump 244. The voltage source 240 generates a set potential difference between the charge pump 244 and the gate of the first transistor 232. The set potential difference of the voltage source 240 is configured to turn on the first transistor 232. Advantageously, the voltage source 240 ensures that the first transistor 232 remains turned on, such as to enable a potential difference between the second source input of the fully-differential amplifier 220 and the charge pump 244.

The charge pump 244 is coupled to the differential-to-single-ended stage 180, the current source 236, and the voltage source 240. The charge pump 244 may be a direct current (DC)-to-DC converter, which is capable of using a current to generate negative voltages. The charge pump 244 sets a low common-mode voltage ($V_{REF3}$) using current from the current source 236 and current through the resistors 264 and 268. Advantageously, the charge pump 244 causes the common-mode range of the difference amplifier 160 to include voltages below zero volts (e.g., ground).

A source of the second transistor 248 is coupled to the first resistor 212 and the fully-differential amplifier 220. A drain of the second transistor 248 is coupled to the source of the third transistor 252, and a gate of the second transistor 248 is coupled to inverting output of the fully-differential amplifier 220. The second transistor 248 sources current through the first resistor 212 when turned on. The second transistor 248 does not source current when turned off. The second transistor 248 allows the fully-differential amplifier 220 to decrease the voltage of the non-inverting input by turning on the second transistor 248 as described above in connection with the fully-differential amplifier 220. The second transistor 248 is a P-channel MOSFET. Alternatively, the first transistor 232 may be a PNP BJT, an N-channel FET, an N-channel IGBT, an N-channel JFET, an N-channel MOSFET, a P-channel FET, a P-channel IGBT, a P-channel JFET, or an NPN BJT.

A drain of the third transistor 252 is coupled to the differential-to-single-ended stage 180 (specifically, the non-inverting input of amplifier 272), and a gate of the third transistor 252 is coupled to the fully-differential amplifier 220. The third transistor 252 is configured to source current from the second transistor 248 when turned on and does not source current when turned off. The third transistor 252 includes a relatively large impedance at the drain to allow a voltage difference between the drain and the source when turned on, while allowing current to flow from the source to the drain. Such a transistor may be implemented by a power transistor, a high-voltage transistor, and/or a drain-extended transistor. The third transistor 252 is a P-channel MOSFET. Alternatively, the first transistor 232 may be a PNP BJT, an N-channel FET, an N-channel IGBT, an N-channel MOSFET, a P-channel FET, a P-channel IGBT, or an NPN BJT.

A source of the fourth transistor 256 is coupled to the second resistor 216 and the fully-differential amplifier 220, and A drain of the fourth transistor 256 is coupled to the fifth transistor 260. A gate of the fourth transistor 256 is coupled to the non-inverting output of the fully-differential amplifier 220. The fourth transistor 256 allows the fully-differential amplifier 220 to decrease the voltage of the inverting input by turning on the fourth transistor 256 as described above in connection with the fully-differential amplifier 220.

A source of the fifth transistor 260 is coupled to the drain of the fourth transistor 256, and a drain of the fifth transistor 260 is coupled to the differential-to-single-ended stage 180 (specifically, the inverting input of amplifier 272). A gate of the fifth transistor 260 is coupled to the fully-differential amplifier 220. The fifth transistor 260 is configured to source current from the fourth transistor 256 when turned on. The fifth transistor 260 prevents the source input from sourcing current when turned off. The fifth transistor 260 includes a relatively large impedance on the drain to allow a voltage difference between the drain and the source when turned on, while allowing current to flow from the source to the drain. The fifth transistor 260 is a P-channel MOSFET. Alternatively, the fifth transistor 260 may be a PNP BJT, an N-channel FET, an N-channel IGBT, an N-channel JFET, an N-channel MOSFET, a P-channel FET, a P-channel IGBT, a P-channel JFET, or an NPN BJT.

Advantageously, the transistors 252 and 260 supply a differential current output of the input stage 170. Advantageously, the differential current output of the transistors 252 and 260 may generate a voltage at the drain of the transistors 252 and 260, which is less than a voltage supplied to the sources. Advantageously, the possibility for a voltage difference between the source and the drain of the transistors 252 and 260 increases the common-mode range of the difference amplifier 160. The input stage 170 supplies the differential current output to the differential-to-single-ended stage 180.

In the example of FIG. 2, the differential-to-single-ended stage 180 includes a fifth example resistor 264, a sixth example resistor 268, an example amplifier 272, a seventh example resistor 276, and an eighth example resistor 280. The differential-to-single-ended stage 180 generates the voltage output 200 by converting the differential current output of the input stage 170 into a single-ended voltage on the voltage output 200.

The fifth resistor 264 is coupled to the charge pump 244, the third transistor 252, the amplifier 272, and the seventh resistor 276. The fifth resistor 264 has a second resistance ($R_2$). The fifth resistor 264 is configured to cause a first intermediate voltage output ($V_{OUT+}$) by generating a voltage drop equal to the resistance of the fifth resistor 264 times the current sourced by the third transistor 252.

The sixth resistor 268 is coupled to the charge pump 244, the fifth transistor 260, the amplifier 272, and the eighth resistor 280. The sixth resistor 268 includes a resistance equal to the resistance of the fifth resistor 264. The sixth resistor 268 is configured to cause a second intermediate voltage output ($V_{OUT-}$) by generating a voltage drop equal to the resistance of the sixth resistor 268 time the current sourced by the fifth transistor 260.

The non-inverting input (+) of amplifier 272 is coupled to the drain of the third transistor 252, the fifth resistor 264, and the seventh resistor 276. The inverting input (−) of the amplifier 272 is coupled to the drain of the fifth transistor 260, the sixth resistor 268 and the eighth resistor 280. The output of the amplifier 272 is coupled to the eighth resistor 280 and the voltage output 200. The amplifier 272 induces a current through the eighth resistor 280 by modifying a voltage of the amplifier output. The amplifier 272 modifies the voltage of the amplifier output to set the voltage of the inverting input equal to the voltage of the non-inverting input. The amplifier 272 sets the voltage output 200 based on the amplifier output which sets the voltages of the inverting and non-inverting input of the amplifier 272 approximately equal.

The seventh resistor 276 is coupled between the amplifier 272 and a reference voltage input ($V_{REF4}$). The seventh resistor 276 has a third resistance ($R_3$). The resistors 264 and 276 comprise a voltage divider, which is capable of offsetting the voltage output 200 by a DC offset.

The eighth resistor 280 is coupled to the amplifier 272 and the voltage output 200. The eighth resistor 280 is coupled between the inverting input of the amplifier 272 and the amplifier output of the amplifier 272. The eighth resistor 280 has a resistance equal to the resistance of the seventh resistor 276. Advantageously, the eighth resistor 280 enables a closed-loop gain of the amplifier 272. The gain of the difference amplifier 160 is approximately equal to the resistance of the resistors 276 and 280 divided by the resistance of the resistors 212 and 216. Advantageously, the resistors 212, 216, 276, and 280 may be configured to amplify the potential difference between the reference inputs 204 and 208.

In some example embodiments, resistors 212 and 268 set the closed loop gain of amplifier front end 170.

In order for the difference amplifier 160 of FIGS. 1 and 2 to support an increasing common-mode range, manufacturers may need to manufacture the fully-differential amplifier 220 using semiconductor process technologies which support relatively high voltage circuit components. One example method is referred to a silicon on insulator (SOI) process. The SOI process involves placing an insulating layer, such as a buried oxide, between a substrate and a doped (such as a P-type) semiconductor layer (such as an epitaxial layer—an epitaxial silicon layer may be used where the substrate is a single-crystal silicon layer) that surrounds semiconductor implementation of circuitry. The buried oxide insolates the substrate from the P-doped region, which allows the substrate to be coupled to a common potential (e.g., ground) that is substantially lower than a voltage coupled to the P-doped region. In some applications, such as the fully-differential amplifier 220, the ability to have relatively large potential differences between the substrate and the P-doped region enables relatively large ranges of operation.

However, the substrate and the P-doped region act as an internal capacitance between the potential coupled to the P-doped region and the substrate, using the buried oxide as a dielectric material. Such an internal capacitance increases settling times across relatively rapid changes in the voltage coupled to the P-doped region, such as rising edges of pulse width modulation (PWM) signals. In the example of the fully-differential amplifier 220, the internal capacitance resulting from such an SOI process prevents the voltage of the second source input from changing at the same speed as the first source input. The difference in speeds of the source inputs causes variations in the regulated potential difference, which prevents the difference amplifier 160 from generating an accurate voltage output 200 until the fully-differential amplifier 220 has settled. Implementation using a conventional SOI process, as described above, may cause a settling time following relatively large voltage transients on the reference inputs 204 and 208. In applications, such as automotive and manufacturing, which often use PWM signals to control devices, the conventional SOI process may cause critical timing issues when in-line current sensing.

FIG. 3 is an illustration of a process and/or device structure improvement to an example semiconductor device 300 configured to reduce common-mode transient step disturbances. The described example embodiments may be implemented in the fully-differential amplifier 220 of FIG. 2 to isolate the second source input ($V_{REF2}$) from a common potential (e.g., ground). In the example of FIG. 3, the semiconductor device 300 includes an example substrate 302, an example buried oxide layer 304, an example N-buried layer 306, a first example P-type layer 308, a second example P-type well 310, a first example terminal 312 (e.g., a contact and an overlying first level metal structure), a first example N-doped region 314 (e.g., a heavily doped region to form a source/drain region), a second example terminal 316 (e.g., a contact and an overlying first level metal structure), a first example insulator 318 (e.g., including a gate insulating layer, gate side walls and a insulative cap on the gate structure), a first example polysilicon region 320 (e.g., a doped polysilicon region used to form a gate, which may or may not be silicided), a second example N-doped region 322 (e.g., a heavily doped region to form a source/drain region), a third example terminal 324 (e.g., a contact and an overlying first level metal structure), a third example N-doped well 326, a fourth example terminal 328 (e.g., a contact and an overlying first level metal structure), a third example P-doped region 330 (e.g., a heavily doped region to form a source/drain region), a fifth example terminal 332 (e.g., a contact and an overlying first level metal structure), a second example insulator 334 (e.g., including a gate insulating layer, gate side walls and a insulative cap on the gate structure), a second example polysilicon region 336 (e.g., a doped polysilicon region used to form a gate, which may or may not be silicided), a fourth example P-doped region 338 (e.g., a heavily doped region to form a source/drain region), and a sixth example terminal 340 (e.g., a contact and an overlying first level metal structure).

In the example of FIG. 3, the semiconductor device 300 includes the N-buried layer 306 between the buried oxide layer 304 and the first P-doped layer 308. The N-buried layer 306 may be coupled to the first source input ($V_{REF1}$) (e.g., VDD) to create a first internal capacitance 342 (illustrated for clarity) between the first source input and a common potential (e.g., ground (GND)) coupled to the substrate layer 302. The N-buried layer 306 additionally creates a second internal capacitance 344 (illustrated for clarity) between the N-buried layer 306 and the P-doped regions 308 and 310. The first internal capacitance 342 prevents variations in the regulated potential difference, illustrated as a regulated supply 346 for clarity, of the fully-differential amplifier 220 by resisting relatively large changes in the common-mode voltage to both of the source inputs of the fully-differential amplifier 220. Advantageously, adding the N-buried layer 306 decreases settling time of the fully-differential amplifier 220 when relatively large common-mode transients are supplied to the reference inputs 204 and 208. Advantageously, the N-buried layer 306 reduces common-mode transient step disturbances by resisting rapid changes to the voltages of the source inputs of the fully-differential amplifier 220, which prevents variations in the regulated supply 346.

The substrate layer 302 is coupled to the common potential (e.g., ground). The buried oxide layer 304 is coupled between the substrate layer 302 and the N-buried layer 306. The buried oxide layer 304 is a dielectric material (e.g., a silicon dioxide layer) configured to electrically isolate the N-buried layer 306 from the substrate layer 302, which results in the first internal capacitance 342.

The N-buried layer 306 abuts regions 308, 310, and 326. The N-buried layer 306 is configured to be coupled to the first source input ($V_{REF1}$) of the fully-differential amplifier 220. The layers 302, 304 and 306 create the first internal capacitance 342 which is configured to be coupled between the first source input of the fully-differential amplifier 220 and the common potential coupled to the substrate layer 302. The first internal capacitance 342 reduces settling time of the fully-differential amplifier 220 by resisting voltage variations across the regulated supply 346 in response to common-mode transients of the reference inputs 204 and 208. An example operation of the first internal capacitance 342 on a common-mode transient is illustrated in connection with FIG. 4.

N-buried layer 306 (and layer 308) may be formed by growing an epitaxial silicon layer on buried oxide layer 304 (which may be formed as a continuous silicon dioxide layer, such as used for SOI, with selective openings filed with doped silicon to make contact with substrate 302 or buried oxide 304 may be selectively grown in regions on substrate 302) and exposed portions of substrate 302. N-buried layer 306 may be in-situ doped during epitaxial silicon growth or may be doped (e.g., by ion implantation or other doping methodology). If buried layer 306 is in-situ doped with n-type dopants, layer 308 will also contain some n-type dopants. As such, a p-type dopant implantation will be performed at a sufficient dosage to cause the layer 308 to become p-type. Subsequently, region 310 is formed by performing a selective implantation step at a higher concentration of p-type dopants, and region 326 is formed using a higher concentration of n-type dopants. Insulating regions 350 are selectively formed in the upper surface of epitaxial layer 308. Insulating regions 350 may be selectively grown silicon dioxide regions and can be used to act as a mask for subsequent dopant implantation steps and/or silicidation steps.

Gate structures are formed by forming a thin insulating layer (such as a grown silicon dioxide or an oxynitride layer) on layer 308. Next, a polysilicon layer is formed on the thin insulating layer. After selectively etching portions of the polysilicon and underlying thin insulating layer, gate sidewalls are formed (e.g., by blanketly depositing a silicon dioxide or an oxynitride layer and selectively etching the layer). Next, the polysilicon structures are doped with n-type dopants or p-type dopants (to form structures 320 and 334) and the top surface of these structures may be silicided (not shown) to reduce the contact resistance of these structures. A capping insulator is formed on structures 320 and 334 to complete the formation of insulators 318 and 334. N-type dopants are selectively implanted (using insulating regions 350 and insulator 318 as a mask) into well 310 at a sufficient concentration to form source/drain regions 314 and 322. Similarly, p-type dopants are selectively implanted (using insulating regions 350 and insulator 334 as a mask) into well 326 at a sufficient concentration to form source/drain regions 330 and 338. Source/drain regions 314, 322, 330 and 338 may be selectively silicided to reduce their contact resistance. Next, insulating layer 352 is blanketly formed. Insulating layer 352 may include multiple layers of insulating material (such as silicon dioxide, silicon nitride, silicon oxynitride, doped silicon dioxide, etc.). After openings are formed in insulating layer 352, a conductive material (such as one or more layers of tungsten, titanium, tantalum, aluminum, copper, a nitride of any of the above, or a mixture or layering of any of the above) is formed in the openings to form conductive contacts. A first layer of metal (such as one or more layers of tungsten, titanium, tantalum, aluminum, copper, a nitride of any of the above, or a mixture or layering of any of the above) is formed (such as by depositing or sputtering) and selectively removed (either by etching or by chemical mechanical polishing, such as used in a damascene process) to form contacts 312, 316, 324, 328, 332, 340 and substrate contact.

In the example of FIG. 3, the regions 310, 314, 320, and 322, the terminals 312, 316, and 324, and the first insulator 318 form an N-channel MOSFET. Although one N-channel MOSFET is illustrated in connection with the semiconductor device 300, the fully-differential amplifier 220 may comprise of a plurality of N-channel MOSFETS with P-doped regions, such as the second P-doped region 310, coupled to the second source input of the fully-differential amplifier 220. The N-buried layer 306 and the second P-doped region 310 form (at least in part) the second internal capacitance 344. The second internal capacitance 344 is configured to be coupled between the first and second source inputs of the fully-differential amplifier 220. The internal capacitances 342 and 344 are configured to prevent transients in the common-mode voltages from modifying the regulated supply 346 of the fully-differential amplifier 220. For example, the common-mode of the difference amplifier 160 may suddenly increase from a common potential to a relatively high voltage when the controller circuitry 120 of FIG. 1 turns on the first transistor 130. In such an example, the first internal capacitance 342 resists the sudden change in voltage to the first source input of the fully-differential amplifier 220, which allows the regulated potential difference to prevent sudden variations in the second source input by regulating the potential difference. Advantageously, the N-buried layer 306 reduces disturbances across the regulated supply 346 by isolating the first P-doped layer 308 from the substrate 302. Such isolations prevents the first P-doped layer 308 and the substrate 302 from creating an internal capacitance of a magnitude that may cause variations to the second source input of the fully-differential amplifier 220. In some examples, multiple N-channel MOSFETs may be formed in well 310 or in other wells (like well 310) in layer 308. In some examples, the N-channel MOSFETs may have the same structure and others may have different structures.

In the example of FIG. 3, the regions 326, 330, 336, and 338, the terminals 328, 332, and 340, and the second insulator 334 comprise a P-channel MOSFET. Although one P-channel MOSFET is illustrated in connection with the semiconductor device 300, the fully-differential amplifier 220 includes a plurality of P-channel MOSFETS with N-doped regions, such as the third N-doped region 326, coupled to the first source input of the fully-differential amplifier 220. In some examples, multiple P-channel MOSFETs may be formed in well 326 or in other wells (like well 326) in layer 308. In some examples, the P-channel MOSFETs may have the same structure and others may have different structures.

In the example of FIG. 3, the semiconductor device 300 illustrates a portion of the fully-differential amplifier 220. The regulated supply 346 is coupled between the source inputs of the fully-differential amplifier 220. The regulated supply 346 causes the fully-differential amplifier 220 to continue to use the common-mode of the reference inputs 204 and 208 as a power supply. For example, the regulated supply 346 may be configured to supply approximately two and a half volts (V) to ensure that the second source input of the fully-differential amplifier 220 is approximately two and a half volts (V) less than the first source input. The regulated supply 346 reduces durations of time that the fully-differential amplifier 220 is outside of an operating region due to variations in the common-mode of the reference inputs 204 and 208 by regulating the second source input to follow the first source input.

Advantageously, the first internal capacitance 342 is created between layers which have a potential difference greater than or equal to a potential difference of the regulated supply 346. The first internal capacitance 342 reduces settling time of the fully-differential amplifier 220 by reducing an impact of relatively large transients in the common-mode voltage of the reference inputs 204 and 208 on the regulated supply 346. Advantageously, the N-buried layer 306 isolates the first P-doped region 308 from the common potential coupled to the substrate layer 302. Advantageously, the N-buried layer 306 reduces a settling time of the difference amplifier 160 of FIGS. 1 and 2 by ensuring that the potential difference across the regulated supply 346 remains approximately equal to a designed potential difference during relatively large input transients. An example of the impact of the first internal capacitance 342 is illustrated and described in connection with FIG. 4, below.

Figure 4:
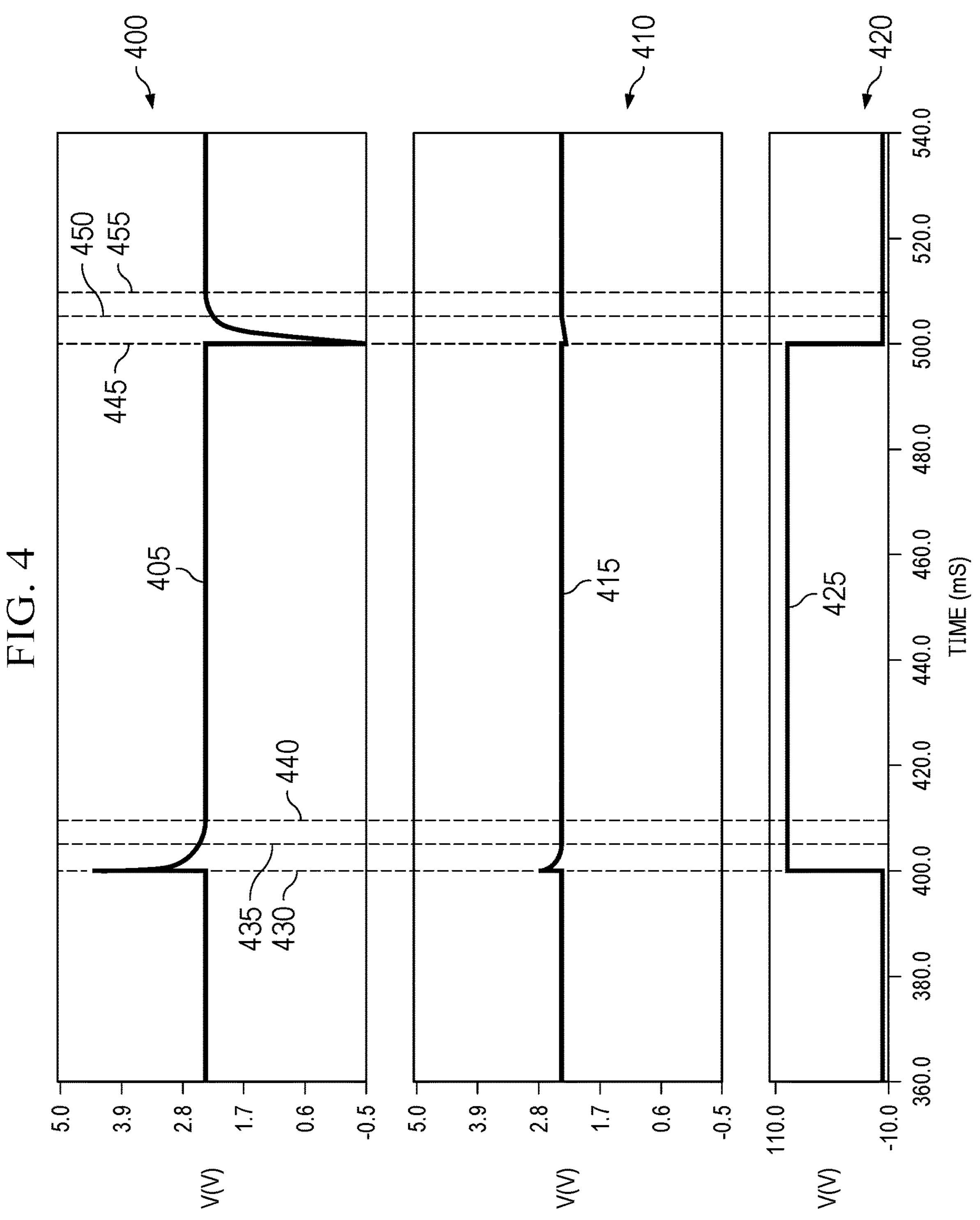
FIG. 4 is a voltage versus time graph that illustrates an example operation of the difference amplifier of FIGS. 1 and 2 including the N-type buried layer of FIG. 3 configured to reduce disturbances to a voltage output of the difference amplifier following rapid changes in a common-mode voltage.

FIG. 4 illustrates an example operation of the difference amplifier 160 of FIGS. 1 and 2 including the N-buried layer 306 of FIG. 3 configured to reduce disturbances in the voltage output 200 of FIG. 2 resulting from relatively large common-mode transients. The example of FIG. 4 includes a first timing diagram 400 (of regulated voltage 405) to illustrate an example operation of the regulated supply 346 of the fully-differential amplifier 220 when the N-buried layer 306 is not situated between the buried oxide layer 304 and the first P-doped region 308. The regulated voltage 405 represents impacts to operations of the difference amplifier 160 when a fully-differential amplifier is implemented in the configuration of FIG. 2 without the benefit of N-buried layer 306. The first timing diagram 400 illustrates disturbances in the regulated supply 346 when a common-mode voltage rapidly increases and rapidly decreases. Such rapid variations in the common-mode may be referred to as transients.

The example of FIG. 4 includes a second timing diagram 410 to illustrate a regulated voltage 415 that is the regulated potential difference across the regulated supply 346 when the fully-differential amplifier 220 includes the N-buried layer 306 between the buried oxide layer 304 and the first P-doped region 308, such as to form the first internal capacitance 342 of FIG. 3. Regulated voltage 415 includes much smaller voltage spikes than voltage 405 due to the addition of the N-buried layer 306 in the implementation of the fully-differential amplifier 220. The second timing diagram 410 illustrates disturbances in an example of the potential difference across the regulated supply 346 when a common-mode voltage rapidly increases and rapidly decreases. Advantageously, the first P-doped region 308 is isolated from the substrate layer 302 by the addition of the N-buried layer 306, which reduces a magnitude of disturbances resulting from rapid variations in the common-mode voltage of the reference inputs 204 and 208 of FIG. 2.

The example of FIG. 4 includes a third timing diagram 420 configured to illustrate a common-mode voltage 425 of the reference inputs 204 and 208. Such a common-mode voltage 425 is representative of the common-mode voltages of the reference inputs 204 and 208, which power the fully-differential amplifier 220, over an example time where the absolute voltage values of the reference inputs 204 and 208 rapidly increase and rapidly decrease.

At a first time 430, the common-mode voltage 425 increases from a relatively low voltage (approximately −10 volts (V)) to a relatively high voltage (approximately 110 volts (V)). For example, the controller circuitry 120 of FIG. 1 turns on the first transistor 130 and turns off the second transistor 140. At the first time 430, the increase in the common-mode voltage 425 may be referred to as a rising edge. At the first time 430, the regulated voltage 405 increases rapidly by approximately one and a half volts (V) as the common-mode voltage 425 increases. The variation in the regulated voltage 405 occurs in response to the first source input of the fully-differential amplifier 220, without the N-buried layer 306, being coupled to a relatively high common-mode voltage while the second source input resists the relatively high potential of the common-mode voltage 425. At the first time 430, the regulated voltage 415 varies by approximately three-hundred millivolts (mV) as the common-mode voltage 425 increases. At the first time 430, the first internal capacitance 342, which results from the addition of the N-buried layer 306, reduces the voltage increase across the regulated supply 346. Following the first time 430, the regulated voltages 405 and 415 begin to settle as the common-mode voltage 425 remains at a relatively high voltage.

At a second time 435, the regulated voltage 415 settles to a voltage of the regulated supply 346 approximately equal to the voltage prior to the first time 430. At the second time 435, the regulated voltage 405 continues to settle at a voltage greater than the voltage of the regulated supply 346 prior to the first time 430. At the second time 435, the fully-differential amplifier 220, which includes the N-buried layer 306, begins to operate in a normal operation, which allows the voltage output 200 of the difference amplifier 160 to be accurate.

At a third time 440, the regulated voltage 405 settles to a voltage of the regulated supply 346 approximately equal to the voltage prior to the first time 430. At the third time 440, the fully-differential amplifier without the N-buried layer (in the configuration of the difference amplifier 160) begins to operate in a normal operation, which allows the voltage output 200 to be accurate. Advantageously, the isolation of the substrate layer 302 and the first P-doped region 308 by the N-buried layer 306 decreases the time between rapid increases in the common-mode voltage 425 and when the difference amplifier 160 provides an accurate voltage on the voltage output 200.

At a fourth time 445, the common-mode voltage 425 decreases from the relatively high voltage (approximately +110 volts (V)) to a relatively low voltage (approximately −10 volts (V)). For example, the controller circuitry 120 turns off the first transistor 130 and turns on the second transistor 140. At the fourth time 445, the decrease in the common-mode voltage 425 may be referred to as a falling edge. At the fourth time 445, the regulated voltage 405 decreases rapidly by approximately three volts (V) as the common-mode voltage 425 decreases. The variation in the regulated voltage 405 occurs in response to the first source input of the fully-differential amplifier 220, without the N-buried layer 306, being coupled to a relatively low common-mode voltage while the second source input resists the relatively low potential of the common-mode voltage 425. At the fourth time 445, the regulated voltage 415 varies by approximately one-hundred millivolts (mV) as the common-mode voltage 425 decreases. At the fourth time 445, the first internal capacitance 342, which results from the addition of the N-buried layer 306, resists and reduces the voltage decrease across the regulated supply 346. Following the fourth time 445, the regulated voltages 405 and 415 begin to settle as the common-mode voltage 425 remains at a relatively low voltage.

At a fifth time 450, the regulated voltage 415 settles to a voltage of the regulated supply 346 approximately equal to the voltage between the times 435 and 445. At the fifth time 450, the regulated voltage 405 continues to settle at a voltage less than the voltage of the regulated supply 346 between the times 440 and 445. At the fifth time 450, the fully-differential amplifier 220, which includes the N-buried layer 306, begins to operate in a normal operation, which allows the voltage output 200 of the difference amplifier 160 to be accurate.

At a sixth time 455, the regulated voltage 405 settles to a voltage of the regulated supply 346 approximately equal to the voltage between times 440 and 445. At the sixth time 455, the fully-differential amplifier, which doesn't include the N-buried layer 306), in the configuration of the difference amplifier 160 begins to operate in a normal operation, which allows the voltage output 200 to be accurate. Advantageously, using the N-buried layer 306 to isolate the substrate layer 302 from the first P-doped region 308 decreases the time between rapid decreases in the common-mode voltage 425 and when the difference amplifier 160 provides an accurate voltage on the voltage output 200.

Figure 5:
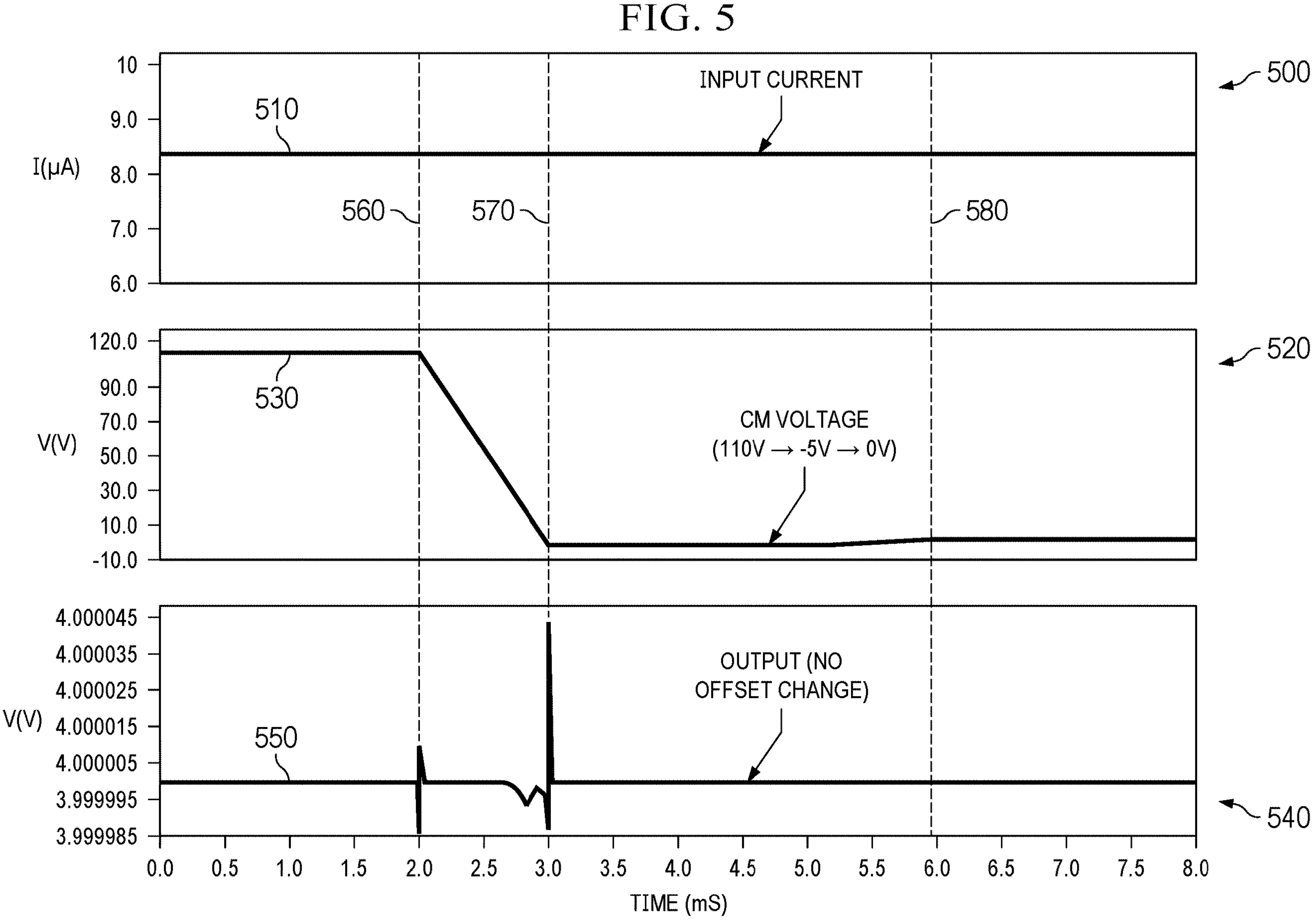
FIG. 5 is a magnitude versus time graph that illustrates an example operation of the difference amplifier of FIGS. 1 and 2 configured to reduce variations in an offset voltage as a common-mode voltage changes.

FIG. 5 illustrates an example operation of the difference amplifier 160 of FIGS. 1 and 2 including the N-buried layer 306 of FIG. 3 illustrating variations in offset as a common-mode voltage changes. The example of FIG. 5 includes a first timing diagram 500 configured to illustrate an example input current 510 over time. The input current 510 is a current supplied to the difference amplifier 160 at the reference inputs 204 and 208 of FIG. 2.

The example of FIG. 5 includes a second timing diagram 520 to illustrate an example common-mode voltage 530 over time. The common-mode voltage 530 is representative of a common-mode voltage at the reference inputs 204 and 208. The example of FIG. 5 includes a third timing diagram 540 to illustrate an example output voltage 550 over time. The output voltage 550 is representative of the voltage output 200 of FIG. 2.

At a first time 560, the common-mode voltage 530 begins to decrease from approximately 110 volts (V). The decrease in the common-mode voltage 530 causes the output voltage 550 to vary in response to the fully-differential amplifier 220 using the common-mode of the reference inputs 204 and 208 as a power source. Advantageously, current feedback of the fully-differential amplifier 220 causes the variation in the output voltage 550 to settle to approximately the same voltage as before the variations at the first time 560, such as to prevent offset voltages on the voltage output 200.

At a second time 570, the common-mode voltage 530 settles at approximately negative five volts (V). Between the times 560 and 570, the common-mode voltage 530 decreases from approximately 110 volts (V) to approximately negative five volts (V). Conventional single-amplifier difference amplifiers with voltage feedback typically cause an offset voltage on the output voltage 550, which reduces the CMRR, and results in a reducing accuracy as the common-mode of the input increases. Relatively low CMRR decreases the accuracy of the difference amplifier and typically results in limitations to the common-mode range of a conventional difference amplifier. However, the difference amplifier 160 reduces voltage offsets on the output voltage 550 using current feedback of the fully-differential amplifier 220, which increases CMRR, thereby allowing for relatively large common-mode ranges where voltage output 200 is accurate. Advantageously, the input stage 170 of FIGS. 1 and 2 increases the CMRR by using the transistors 248 and 256 of FIG. 2 to implement current feedback that reduces offset voltages from approximately 110 volts (V) to approximately negative five volts (V).

At a third time 580, the common-mode voltage 530 has increased from approximately negative five volts (V), at the second time 570, to approximately zero volts (V), which may be referred to as a common potential (e.g., ground). Advantageously, the input current 510 and the output voltage 550 approximately do not vary in response to the increase of the common-mode voltage 530 between the times 570 and 580.

Figure 6:
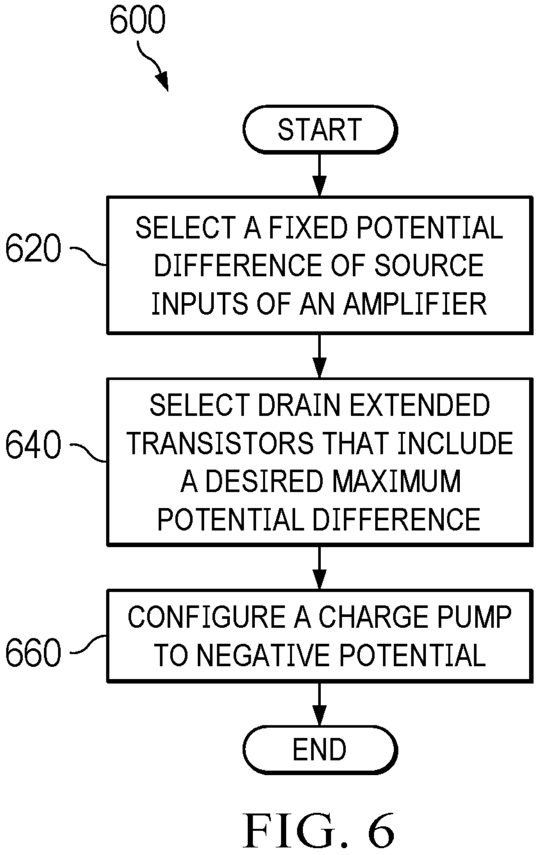
FIG. 6 is a flowchart representative of example operations that may be executed to configure a common-mode range of the difference amplifier of FIGS. 1 and 2.

FIG. 6 is a flowchart representative of an example method of operations 600 that may be executed to configure a common-mode range of the difference amplifier 160 of FIGS. 1 and 2. The method of operations 600 may be performed and/or executed by a designer, manufacturer, processor circuitry, etc. The method of operations 600 of FIG. 6 begin at block 620. At block 620, select a fixed potential difference of source inputs ($V_{REF1}$ and $V_{REF2}$) of the fully-differential amplifier 220 of FIG. 2. As described above in connection with FIG. 2 and the fully-differential amplifier 220, the regulated potential difference is a characteristic of the fully-differential amplifier 220. Specifically, the regulated potential difference results from a feedback loop internal to the fully-differential amplifier 220. The method of operations 600 proceeds to block 640.

At block 640, select drain-extended transistors that include a desired maximum potential difference. For example, selecting the transistors 232, 252, and 260 of FIG. 2 to be drain-extended transistors designed to be capable of approximately one-hundred and twenty volts (V) maximum voltage difference between the sources and drains. The maximum voltage difference is a characteristic of the transistors 232, 252, and 260, typically associated with an internal impedance. The voltage difference between the drains and sources of the transistors 232, 252, and 260 set a common-mode range of the difference amplifier 160. For example, a maximum voltage difference of one-hundred and twenty volts (V) allows the source of the first transistor 232 to be coupled to a voltage one-hundred and twenty volts (V) less than a voltage coupled to the drain of the first transistor 232. Advantageously, increasing the maximum voltage difference of the drain-extended transistors increases the common-mode range of the difference amplifier. The method of operations 600 proceeds to block 660.

At block 660, configure the charge pump 244 of FIG. 2 to a negative potential. The negative potential generated by the charge pump 244 is a minimum voltage common-mode voltage which may be represented by the difference amplifier 160. However, a potential difference across the current source 236 of FIG. 2 may increase the minimum common-mode voltage capable of being represented by the difference amplifier 160. The method of operations 600 proceeds to end.

The common-mode range of the difference amplifier 160 has a minimum common-mode voltage ($V_{MIN}$) approximately equal to a voltage being generated by the charge pump 244 plus a voltage difference across the current source 236. The common-mode range of the difference amplifier 160 has a maximum common-mode voltage ($V_{MAX}$) approximately equal to the minimum common-mode voltage, plus the maximum potential difference across the drain-extended transistors (such as transistors 232, 252, and 260) and the fixed potential difference of the source inputs of the fully-differential amplifier 220. Advantageously, the common-mode range of the difference amplifier 160 may be increased by selecting drain-extended transistors which include relatively high maximum voltage differences between drains and sources.

Although example methods are described with reference to the flowchart illustrated in FIG. 6, many other methods of setting a common-mode range of the difference amplifier 160 may alternatively be used in accordance with this description. For example, the order of execution of the blocks may be changed, and/or some of the blocks described may be changed, eliminated, or combined. Similarly, additional operations may be included in the manufacturing process before, in between, or after the blocks shown in the illustrated examples.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are:

(i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero.

Modifications are possible in the described embodiments, and other embodiments are possible, within the scope of the claims.

What is claimed is:

1. An apparatus comprising:

a differential amplifier including:

an inverting input coupled to a first input via a first resistor;

a non-inverting input coupled to a second input via a second resistor;

a first supply input;

a second supply input coupled to a current source;

a non-inverting output; and an inverting output;

a third resistor having a first terminal coupled to the first input and the first resistor;

a fourth resistor having a first terminal coupled to the second input and the second resistor and a second terminal coupled to the first supply input and a second terminal of the third resistor;

a first transistor including a first control terminal and a first current terminal, the first control terminal coupled to the non-inverting output and the first current terminal coupled to the inverting input; and a second transistor including a second control terminal and a second current terminal, the second control terminal coupled to the inverting output and the second current terminal coupled to the non-inverting input.

2. The apparatus of claim 1, wherein the first transistor further includes a third current terminal and the second transistor further includes a fourth current terminal, and wherein the apparatus further comprises:

a third transistor including a third control terminal and a fifth current terminal, the third control terminal coupled to the second supply input, and the fifth current terminal coupled to the third current terminal; and a fourth transistor including a fourth control terminal and a sixth current terminal, the fourth control terminal coupled to the second supply input, and the sixth current terminal coupled to the fourth current terminal.

3. The apparatus of claim 1, wherein the first transistor further includes a third current terminal and the second transistor further includes a fourth current terminal, and wherein the apparatus further comprises:

a charge pump;

a fifth resistor configured to be coupled between the third current terminal and the charge pump; and a sixth resistor configured to be coupled between the fourth current terminal and the charge pump.

4. The apparatus of claim 1, further comprising a third transistor including a third current terminal and a fourth current terminal, the third current terminal coupled to the second supply input, and the fourth current terminal coupled to the current source.

5. The apparatus of claim 1, wherein the differential amplifier is a first differential amplifier, wherein the first transistor further includes a third current terminal, wherein the second transistor further includes a fourth current terminal, and wherein the apparatus further comprises a second differential amplifier configured to be coupled to the third current terminal and the fourth current terminal.

6. A device comprising:

a first input;

a second input;

an input stage coupled to the first input and the second input, the input stage including:

a first transistor including a first control terminal, a first current terminal, and a second current terminal;

a second transistor including a second control terminal, a third current terminal, and a fourth current terminal;

a differential amplifier including:

a supply input coupled;

an inverting input coupled to the first current terminal;

a non-inverting input coupled to the third current terminal;

a first output coupled to the first control terminal; and a second output coupled to the second control terminal;

a first resistor having a first terminal coupled to the supply input and a second terminal coupled to the first input;

a second resistor having a first terminal coupled to the supply input and the first terminal of the first resistor and a second terminal coupled to the second input;

a third resistor coupled between the inverting input and the first input; and a fourth resistor coupled between the non-inverting input and the second input; and a differential-to-single ended converter coupled to the second current terminal and the fourth current terminal.

7. The device of claim 6, wherein the supply input is a first supply input, the differential amplifier further including a second supply input, the input stage further comprising:

a third transistor including a third control terminal and a fifth current terminal, the third control terminal coupled to the second supply input, and the fifth current terminal coupled to the second current terminal; and a fourth transistor including a fourth control terminal and a sixth current terminal, the fourth control terminal coupled to the second supply input, and the sixth current terminal coupled to the fourth current terminal.

8. The device of claim 6, further comprising:

a charge pump;

a fifth resistor configured to be coupled between the second current terminal and the charge pump; and a sixth resistor configured to be coupled between the fourth current terminal and the charge pump.

9. The device of claim 6, wherein the supply input is a first supply input, wherein the differential amplifier further includes a second supply input, and wherein the device further comprises a third transistor including a fifth current terminal and a sixth current terminal, the fifth current terminal coupled to the second supply input, and the sixth current terminal coupled to a current source.

10. The device of claim 6, wherein the differential amplifier is a first differential amplifier, the first transistor further includes a fifth current terminal, and the second transistor further includes a sixth current terminal, and wherein the device further comprises a second differential amplifier configured to be coupled to the fifth current terminal and the sixth current terminal.

11. A difference amplifier having a first reference terminal operable to be coupled to a first terminal of a first resistor and having a second reference terminal operable to be coupled to a second terminal of the first resistor, the difference amplifier comprising:

an input stage coupled to the first reference terminal and the second reference terminal, the input stage including:

a floating differential amplifier coupled to the first reference terminal and the second reference terminal, the floating differential amplifier configured to convert a differential voltage across the first resistor to a differential output;

a first transistor coupled to the floating differential amplifier, the first transistor configured to be controlled by the differential output and pass a first current from the first reference terminal;

a second transistor coupled to the floating differential amplifier, the second transistor configured to be controlled by the differential output and pass a second current from the second reference terminal;

a second resistor configured to cause a first intermediate voltage by generating a first voltage drop based on the first current;

a third resistor configured to cause a second intermediate voltage by generating a second voltage drop based on the second current;

a fourth resistor coupled between the first reference terminal and a supply input of the floating differential amplifier; and a fifth resistor coupled between the second reference terminal and the supply input of the floating differential amplifier; and a differential amplifier configured to convert a differential voltage based on a difference between the first intermediate voltage and the second intermediate voltage to a single-ended voltage.

12. The difference amplifier of claim 11, further comprising:

a third transistor configured to pass current from the first transistor and enable a voltage difference between a first current terminal and a second current terminal, the first current terminal coupled to the first intermediate voltage; and a fourth transistor configured to pass current from the second transistor and enable a voltage difference between a third current terminal and a fourth current terminal, the third current terminal coupled to the second intermediate voltage.

13. The difference amplifier of claim 11, further comprising a charge pump coupled to the second resistor and the third resistor, the charge pump configured to increase a common-mode range of the floating differential amplifier.

14. The difference amplifier of claim 13, further comprising a current source coupled to the floating differential amplifier by a third transistor.

15. The difference amplifier of claim 11, wherein the floating differential amplifier further comprises:

a substrate layer;

an N-type buried layer configured to be coupled to the first reference terminal by a fourth resistor; and a buried oxide layer coupled between the substrate layer and the N-type buried layer.

16. The difference amplifier of claim 15, wherein the N-type buried layer is configured to be coupled to the first reference terminal by the fourth resistor and coupled to the second reference terminal by a fifth resistor.

17. The difference amplifier of claim 11, wherein the fourth and fifth resistors are configured to set the supply input using a common-mode voltage of the first and second reference terminals.

18. An apparatus comprising:

a differential amplifier including:

an inverting input coupled to a first input via a first resistor;

a non-inverting input coupled to a second input via a second resistor;

a first supply input coupled to the first input via a third resistor, and the first supply input coupled to the second input via a fourth resistor;

a second supply input coupled to a current source;

a non-inverting output;

an inverting output;

a substrate layer;

an N-type buried layer coupled to the first supply input; and a buried oxide layer coupled between the substrate layer and the N-type buried layer;

a first transistor including a first control terminal and a first current terminal, the first control terminal coupled to the non-inverting output and the first current terminal coupled to the inverting input; and a second transistor including a second control terminal and a second current terminal, the second control terminal coupled to the inverting output and the second current terminal coupled to the non-inverting input.

19. The apparatus of claim 18, wherein the first transistor further includes a third current terminal and the second transistor further includes a fourth current terminal, further comprising:

a third transistor including a third control terminal and a fifth current terminal, the third control terminal coupled to the second supply input, and the fifth current terminal coupled to the third current terminal; and a fourth transistor including a fourth control terminal and a sixth current terminal, the fourth control terminal coupled to the second supply input, and the sixth current terminal coupled to the fourth current terminal.

20. The apparatus of claim 18, wherein the first transistor further includes a third current terminal and the second transistor further includes a fourth current terminal, further comprising:

a charge pump;

a fifth resistor configured to be coupled between the third current terminal and the charge pump; and a sixth resistor configured to be coupled between the fourth current terminal and the charge pump.

21. The apparatus of claim 18, further comprising a third transistor including a third current terminal and a fourth current terminal, the third current terminal coupled to the second supply input, and the fourth current terminal coupled to the current source.

22. The apparatus of claim 18, wherein the N-type buried layer is configured to be coupled to the first input by the third resistor and coupled to the second input by the fourth resistor.

23. The apparatus of claim 18, wherein the differential amplifier is a first differential amplifier, the first transistor further includes a third current terminal, and the second transistor further includes a fourth current terminal, further comprising a second differential amplifier configured to be coupled to the third current terminal and the fourth current terminal.

24. A device comprising:
- a first input;
- a second input;
- an input stage coupled to the first input and the second input, the input stage including:
  - a first transistor including a first control terminal, a first current terminal, and a second current terminal;
  - a second transistor including a second control terminal, a third current terminal, and a fourth current terminal;
  - a differential amplifier including:
    - a supply input coupled;
    - an inverting input coupled to the first current terminal;
    - a non-inverting input coupled to the third current terminal;
    - a first output coupled to the first control terminal;
    - a second output coupled to the second control terminal;
    - a substrate layer;
    - an N-type buried layer coupled to the supply input; and
    - a buried oxide layer coupled between the substrate layer and the N-type buried layer;
  - a first resistor coupled between the supply input and the first input;
  - a second resistor coupled between the supply input and the second input;
  - a third resistor coupled between the inverting input and the first input; and
  - a fourth resistor coupled between the non-inverting input and the second input; and
- a differential-to-single ended converter coupled to the second current terminal and the fourth current terminal.

25. The device of claim 24, wherein the N-type buried layer is configured to be coupled to the first input by the first resistor and coupled to the second input by the second resistor.

* * * * *